(12) United States Patent
Lee

(10) Patent No.: US 7,606,080 B2
(45) Date of Patent: Oct. 20, 2009

(54) ERASE VERIFYING METHOD OF NAND FLASH MEMORY DEVICE

(75) Inventor: Ju Yeab Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 100 days.

(21) Appl. No.: 11/967,136

(22) Filed: Dec. 29, 2007

(65) Prior Publication Data

US 2008/0247240 A1   Oct. 9, 2008

(30) Foreign Application Priority Data

Apr. 6, 2007   (KR) .................... 10-2007-0034106

(51) Int. Cl.
*G11C 16/00* (2006.01)

(52) U.S. Cl. ..................... 365/185.29; 365/185.17; 365/185.18; 365/185.22; 365/185.33

(58) Field of Classification Search ............ 365/185.05
See application file for complete search history.

(56) References Cited

U.S. PATENT DOCUMENTS

| 5,615,147 | A | * | 3/1997 | Chang et al. | ............. 365/185.3 |
| 5,995,417 | A | * | 11/1999 | Chen et al. | ............. 365/185.29 |
| 7,154,787 | B2 | | 12/2006 | Omoto | |
| 7,272,050 | B2 | | 9/2007 | Han et al. | |
| 7,333,371 | B2 | * | 2/2008 | Hosono | ................ 365/189.05 |

* cited by examiner

*Primary Examiner*—Tan T. Nguyen
(74) *Attorney, Agent, or Firm*—Townsend and Townsend and Crew LLP

(57) ABSTRACT

In an erase verifying method of a NAND flash memory device, a power supply voltage (Vcc) is applied to a second bit line while precharging a first bit line to a first positive voltage. Select transistors are turned on, and a ground voltage is applied to word lines of memory cell transistors. A second positive voltage is applied to source lines to which sources of the select transistors and the memory cell transistors are connected. An erased state of the memory cell transistor is verified according to whether charges accumulated in the first bit line are discharged.

17 Claims, 6 Drawing Sheets

ERASE VERIFYING METHOD OF NAND FLASH MEMORY DEVICE

CROSS-REFERENCE TO RELATED APPLICATIONS

The present application claims priority to Korean patent application number 10-2007-0034106, filed on Apr. 6, 2007, which is incorporated by reference in its entirety.

BACKGROUND OF THE INVENTION

The present invention relates to a data verifying method of a flash memory device, and more particularly, to an erase verifying method of a NAND flash memory, which can verify if an erase operation has been normally performed.

Recently, demand for flash memory devices is increasing because they are electrically programmable and erasable and do not require a refresh operation. Further, studies have been actively conducted on high-integration technologies for developing high-capacity memory devices that are capable of storing more data. For the purpose of high integration in a NAND flash memory device, a plurality of memory cells are serially connected to form one string. Unlike a NOR flash memory device, the NAND flash memory device reads data in sequence. The NAND flash memory device performs a program/erase operation using Fowler-Nordheim tunneling. Specifically, the NAND flash memory device performs the program/erase operation by controlling threshold voltages (Vt) of memory cells while injecting electrons into floating gates or discharging electrons from floating gates.

In the NAND flash memory device, it is very important to ensure reliability of memory cells. Particularly, data retention characteristic of the memory cells is considered very important. However, since the NAND flash memory device performs the program/erase operation using F-N tunneling, electrons are trapped in a tunnel oxide layer of the memory cell during repetitive F-N tunneling process. Due to the trapped electrons, the threshold voltage of the memory cell is shifted. Therefore, data stored in the memory cell may be incorrectly read in a read operation, degrading the reliability of the memory device.

The shift of the threshold voltage of the memory cell may be caused by the repetitive F-N tunneling process from the repeated cycling of the program operation and the erase operation. One method for preventing the shift of the threshold voltage of the memory cell is to sufficiently decrease an erase voltage to less than a verify voltage by controlling a bias condition in the program operation and the erase operation. However, the threshold voltage may be shifted because the threshold voltage is also increased as much as a bias voltage.

When a program operation or erase operation of a memory cell of a cell string is completed, charges may or may not exist in the floating gate of the memory cell transistor.

As illustrated in FIG. 1, an erased memory cell exhibits a negative threshold voltage distribution 110, while a programmed memory cell exhibits a positive threshold voltage distribution 120. However, it is almost impossible to monitor the negative threshold voltage of the memory cell. An allowable lowest word line bias voltage in the NAND flash memory device is 0 V because a negative voltage is not used as a word line bias voltage. Therefore, if a threshold voltage of a memory cell is lower than 0V in an erase verify operation performed after the erase operation, the corresponding memory cell is determined as an erased memory cell.

In this way, memory cells having threshold voltages lower than 0V are determined as erased memory cells in the erase verify operation. For example, a memory cell having a threshold voltage of −2V is determined as an erased memory cell, and a memory cell having a threshold voltage of −0.1V is also determined as an erased memory cell. There is no problem with the memory cell having the threshold voltage of −2 V. However, problems may occur in the memory cell having a threshold voltage of −0.1V. The threshold voltage of the erased memory cell may be shifted by the influence of the program or erase operation on adjacent memory cells, or the degradation of the memory cell due to the repetitive program/erase operations on the corresponding memory cell. Therefore, the threshold voltage of the erased memory cell having the threshold voltage close to 0 V is easily shifted above 0 V. Hence, even though a memory cell is determined as an erased memory cells in the erase verify operation, its threshold voltage may increase higher than 0 V due to various factors, thus degrading the reliability of the semiconductor memory device.

FIG. 2 illustrates threshold voltage distributions of memory cells when erase verification is passed.

Due to various factors, the threshold voltage of the memory cell increases when the erase verification is passed. This shifts the threshold voltage of the erased memory cell. As illustrated in FIG. 2, the threshold voltage is shifted from the left 210 to the right 220 and thus an erase verification line is also shifted to the right. In this case, a margin between the erase verify voltage and a read voltage (Vread) used to detect a state of the memory cell is reduced. Therefore, the read operation may be incorrectly performed, caused by a disturb characteristic of the memory cell and a temperature influence. Further, the threshold voltage of the memory cell greatly varies due to the repeated cycling of the program/erase operation or read disturbance. Consequently, it is necessary to ensure an additional margin between the read voltage and the erase verify voltage.

SUMMARY OF THE INVENTION

Embodiments of the present invention relate to an erase verifying method of a NAND flash memory, which can increase a margin between an erase verify voltage and a read voltage, thereby preventing a read fail.

In one embodiment, a method for operating a flash memory device includes performing an erase operation on a plurality of cell strings and performing an erase verification on a selected cell string. The selected cell string includes a drain select transistor, a plurality of memory cells, and a source select transistor, which are connected in series. The drain select transistor is connected to a bit line. The source select transistor is connected to a common source line. The erase verification step includes precharging the bit line to a first positive voltage, turning on the drain and source select transistors, applying a ground voltage to word lines of the memory cells, applying a second positive voltage to the common source line, and verifying whether the memory cells have been erased properly.

In one implementation, the erase operation is performed on a block including a plurality of cell strings, wherein a pair of cell strings is grouped with a page buffer. The erase verification is performed on one of the pairs of the cell strings.

In one implementation, the second positive voltage is lower than the first positive voltage. The first positive voltage is approximately 2 V and the second positive voltage is approximately 1 V.

In one implementation, the first positive voltage is about 1 volt higher than the second positive voltage, e.g., no more than about 1 volt higher, or no more than about 1.5 volt higher, or no more than about 1.2 volt higher, or no more than about 0.8 volt higher.

In one embodiment, there is provided an erase verifying method of a NAND flash memory device, the NAND flash memory device including a selected first bit line and an unselected second bit line, the first and second bit lines being connected to cell strings each having a drain select transistor, a plurality of memory cell transistors, and a source select transistor, which are connected in series. The erase verifying method includes: applying a power supply voltage (Vcc) to the second bit line while precharging the first bit line to a first positive voltage; turning on the select transistors, applying a ground voltage to word lines of the memory cell transistors, and applying a second positive voltage to source lines to which sources of the select transistors and the memory cell transistors are connected; and verifying an erased state of the memory cell transistor according to whether charges accumulated in the first bit line are discharged.

The erase verifying method may further include applying a control signal (BSL) having the power supply voltage (Vcc) so as to select one of the first bit line and the second bit line.

The ground voltage applied to the word lines of the memory cell transistors may be 0 V.

The second positive voltage may be lower than the first positive voltage.

The first positive voltage may be approximately 2 V and the second positive voltage may be approximately 1 V.

The erase verifying method may further include applying a pass voltage (Vpass) of approximately 5.5 V to gates of the drain select transistor and the source select transistor.

Before the applying of the power supply voltage to the second bit line wile precharging the first bit line, the erase verifying method may further include: discharging charges accumulated in the first bit line and the second bit; and setting a page buffer connected to the first bit line and the second bit line.

DESCRIPTION OF SPECIFIC EMBODIMENTS

Hereinafter, an erase verifying method of a semiconductor memory device in accordance with the present invention will be described in detail with reference to the accompanying drawings.

An erase verify method of a NAND flash memory device according to embodiments of the present invention can reduce an erase verify voltage without applying a negative bias voltage to a word line of a selected memory cell using a body effect, thereby ensuring a margin between an erase verify voltage and a read voltage.

According to the related art, after an erase operation on a memory cell is completed, an erase verify operation is performed by applying a voltage (Vso) of 0 V to a common source line (CSL) connected to a source of the memory cell and applying a voltage (Vdr) of 1 V to a bit line. However, since a constant bias, which is not 0 V, is applied to the common source line (CSL) and the bit line, the erase state of the memory cell is verified by providing the same effect when a negative voltage is applied to the bulk.

Figure 1:
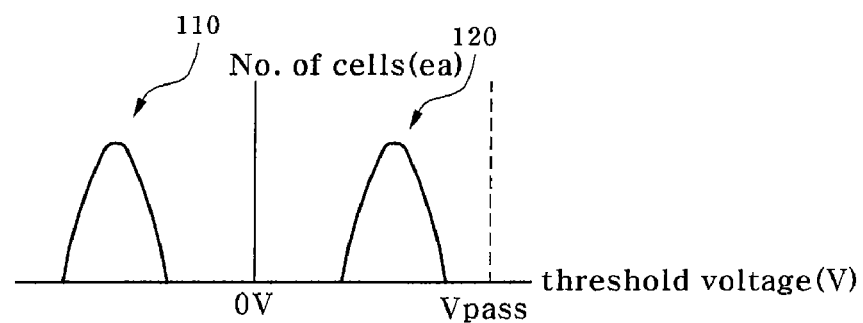
FIG. 1 illustrates threshold voltage distributions in an erased state and a programmed state of a NAND flash memory device.
Figure 2:
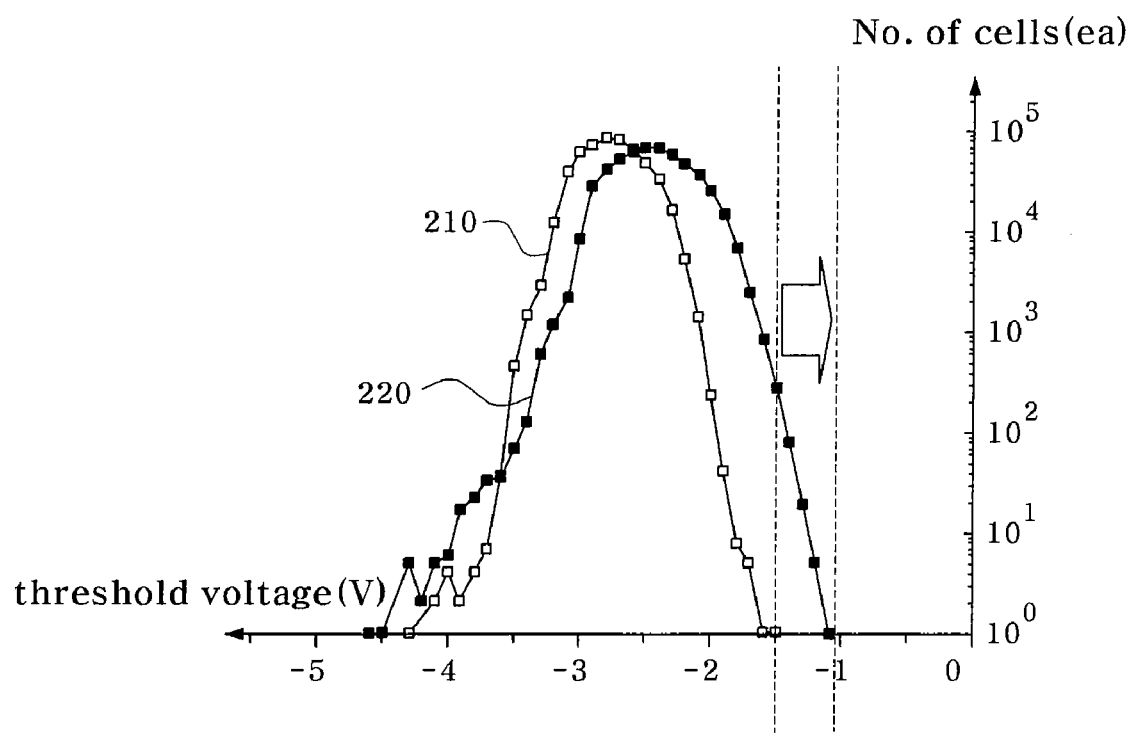
FIG. 2 illustrates threshold voltage distributions of memory cells when erase verification is passed.
Figure 3:
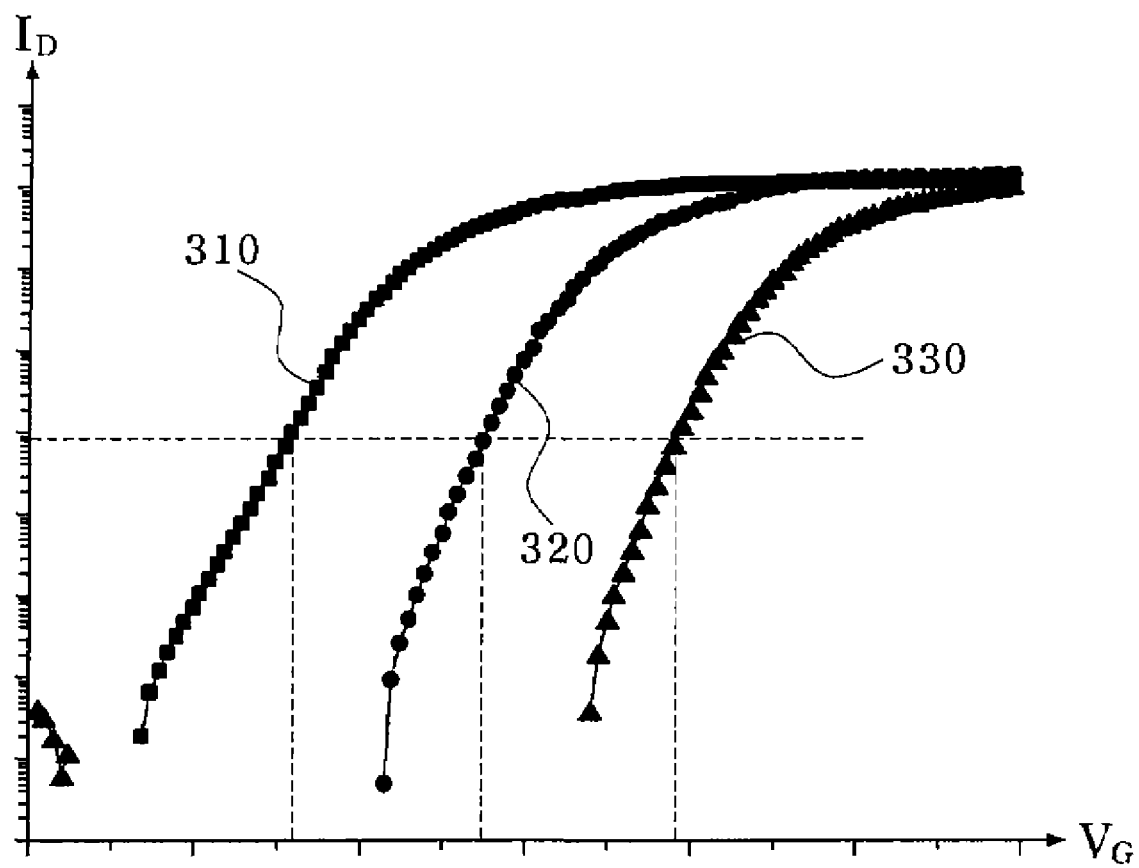
FIG. 3 illustrates a variation of a drain current with respect to a gate voltage of a memory cell according to a voltage applied to a bit line.
Figure 4:
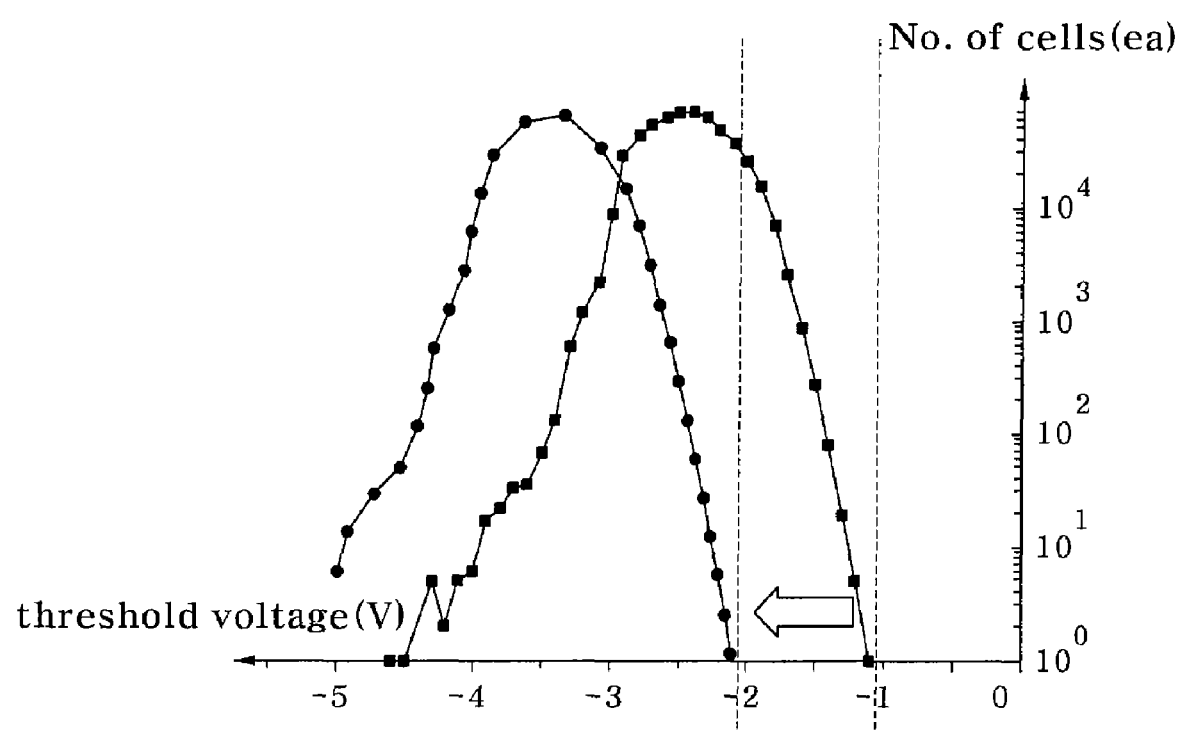
FIG. 4 illustrates a decrease of an erase verify voltage according to an increase of a voltage (Vso) applied to a source line.

FIG. 3 illustrates a variation of a drain current with respect to a gate voltage of a memory cell according to a voltage applied to a bit line, and FIG. 4 illustrates a decrease of an erase verify voltage according to an increase of a voltage (Vso) applied to a source line.

Referring to FIG. 3, a graph 310 represents a case where the voltage (Vso) applied to the source line is 0 V, a graph 320 represents a case where the voltage (Vso) applied to the source line is 1 V, and a graph 330 represents a case where the voltage (Vso) applied to the source line is 2 V. It can be seen from FIG. 3 that as the voltage (Vso) applied to the source line increases, the gate voltage ($V_G$) increases. This means that the threshold voltage (Vt) of the memory cell increases.

As illustrated in FIG. 4, compared with the related art, the erase verify voltage can be reduced by 1 V or more by applying a bias voltage of 0 V to the word line of the memory cell, a bias voltage of 1 V to the source line, a bias voltage of 2 V to the bit line, and a bias voltage of 0 V to the bulk. In addition, if a voltage (Vso) of 2 V is applied to the source line, the erase verify voltage can be adjusted to be relatively lower.

Figure 5:
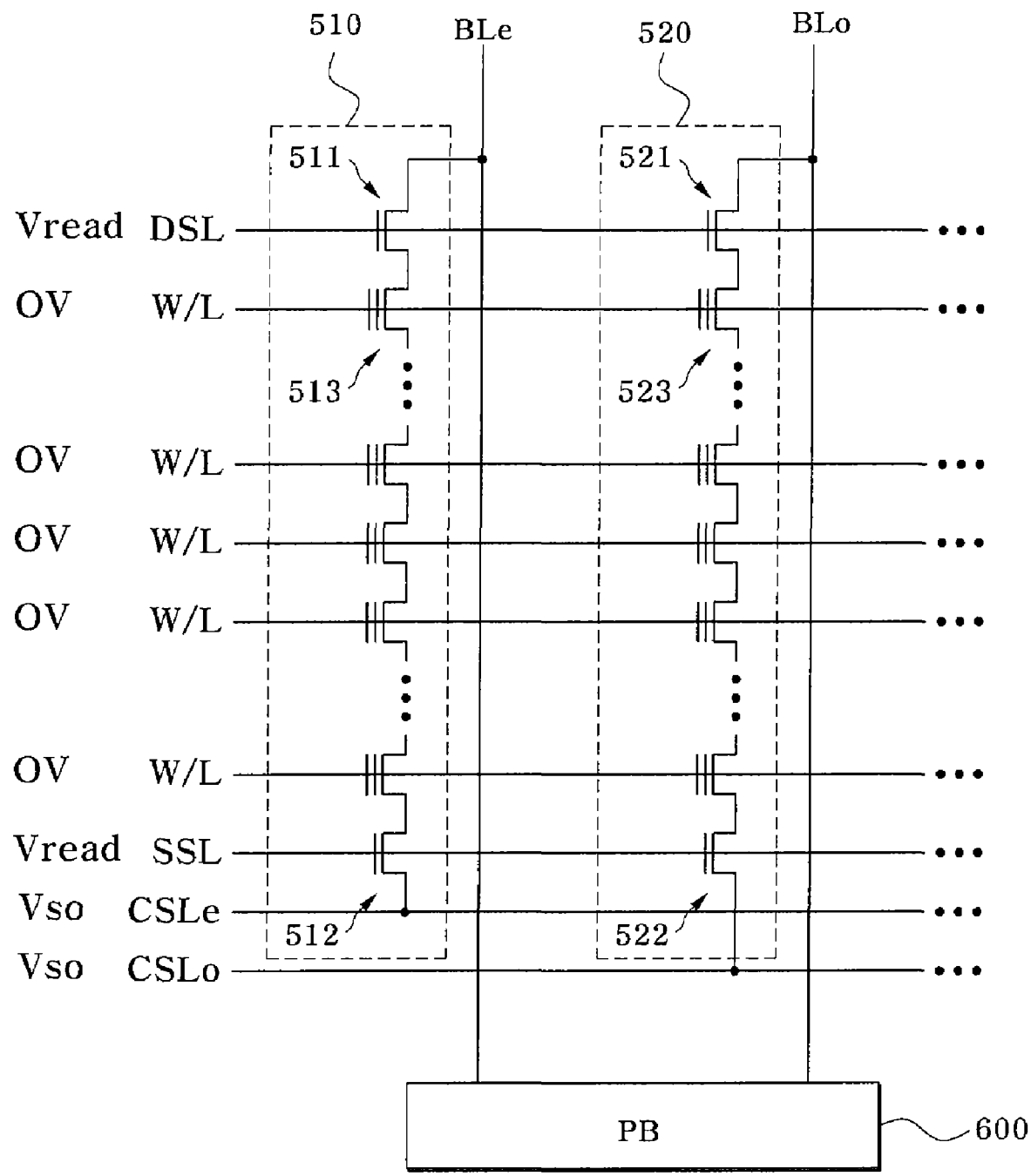
FIG. 5 illustrates a circuit diagram of a memory cell string of a NAND flash memory.

FIG. 5 illustrates a circuit diagram of a memory cell string of a NAND flash memory.

Referring to FIG. 5, the NAND flash memory device includes a memory cell array as a data storage region. The memory cell array of the NAND flash memory device includes a plurality of cell strings 510 and 520 connected to corresponding bit lines BLe and BLo. Although only two cell strings are illustrated in FIG. 5, more than two cell strings can be arranged in the memory cell array.

The cell string 510 includes a drain select transistor 511 connected to the bit line BLe, a source select transistor 512 connected to the common source line CSLe, and a plurality of memory cell transistors 513 serially connected between the drain select transistor 511 and the source select transistor 512. The cell string 520 includes a drain select transistor 521 connected to the bit line BLo, a source select transistor 522 connected to the common source line CSLo, and a plurality of memory cell transistors 523 serially connected between the drain select transistor 521 and the source select transistor 522. The memory cell transistor 513 and the memory cell transistor 523 are alternately arranged in the cell string 510 connected to the even bit line BLe and the cell string 520 connected to the odd bit line BLo. The even bit line BLe and the odd bit line BLo are connected to one page buffer (PB) 600.

Figure 6:
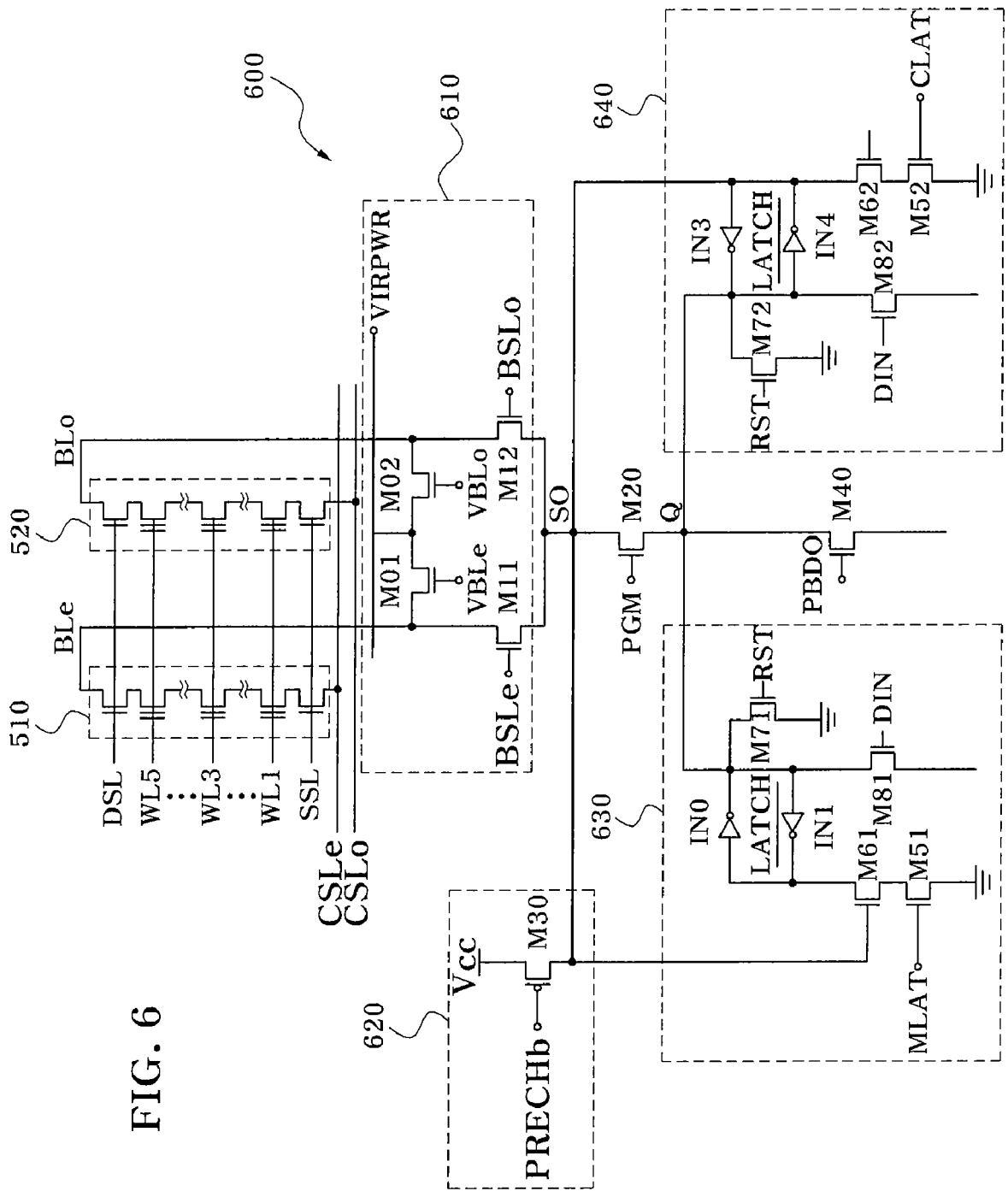
FIG. 6 illustrates a page buffer for controlling an erase verify operation of a NAND flash memory device according to one embodiment of the present invention.

FIG. 6 illustrates the page buffer for controlling the erase verify operation of the NAND flash memory device according to one embodiment of the present invention.

Referring to FIG. 6, the page buffer 600 includes a bit line select/bias circuit 610, a precharge circuit 620, a main register circuit 630, and a cache register circuit 640.

The bit line select/bias circuit 610 selects one of the even bit line BLe and the odd bit line BLo and applies a preset bias to the selected bit line. The bit line select/bias circuit 610 includes four NMOS transistors M01, M02, M11 and M12. The NMOS transistor M01 is controlled by a control signal VBLe, the NMOS transistor M02 is controlled by a control signal VBLo, the NMOS transistor M11 is controlled by a control signal BSLe, and the NMOS transistor M12 is controlled by a control signal BSLo.

The precharge circuit 620 precharges the selected bit line to a predetermined voltage level. The precharge circuit 620 includes one PMOS transistor M30. The PMOS transistor M30 is connected between a power supply voltage terminal Vcc and a sensing node S0 and is controlled by a control signal PRECHb.

The main register circuit 630 latches the most significant bit (MSB) of a 2-bit data. MSB may also be referred herein as the "first data bit." The main register circuit 630 includes NMOS transistors M51, M61, M71 and M81 and a latch LATCH implemented with two inverters IN0 and IN1. The NMOS transistor M61 has a gate connected to the sensing node S0 and is switched according to a bias state of the sensing node S0. The NMOS transistor M51 is controlled by a control signal MLAT, the NMOS transistor M71 is controlled by a control signal RST, and the NMOS transistor M81 is connected between a Q node of the latch LATCH and an external data input line and is controlled by a control signal DIN.

The cache register circuit 640 latches the least significant bit (LSB) of the 2-bit data. LSB may also be referred herein as the "last data bit." The cache register circuit 640 includes NMOS transistors M52, M62, M72 and M82 and a latch LATCH implemented with two inverters IN3 and IN4. The NMOS transistor M52 is controlled by a control signal CLAT, and the NMOS transistor M72 is controlled by the control signal RST. The NMOS transistor M82 is connected to the Q node of the latch LATCH and the external data input line and is controlled by the control signal DIN.

Figure 7:
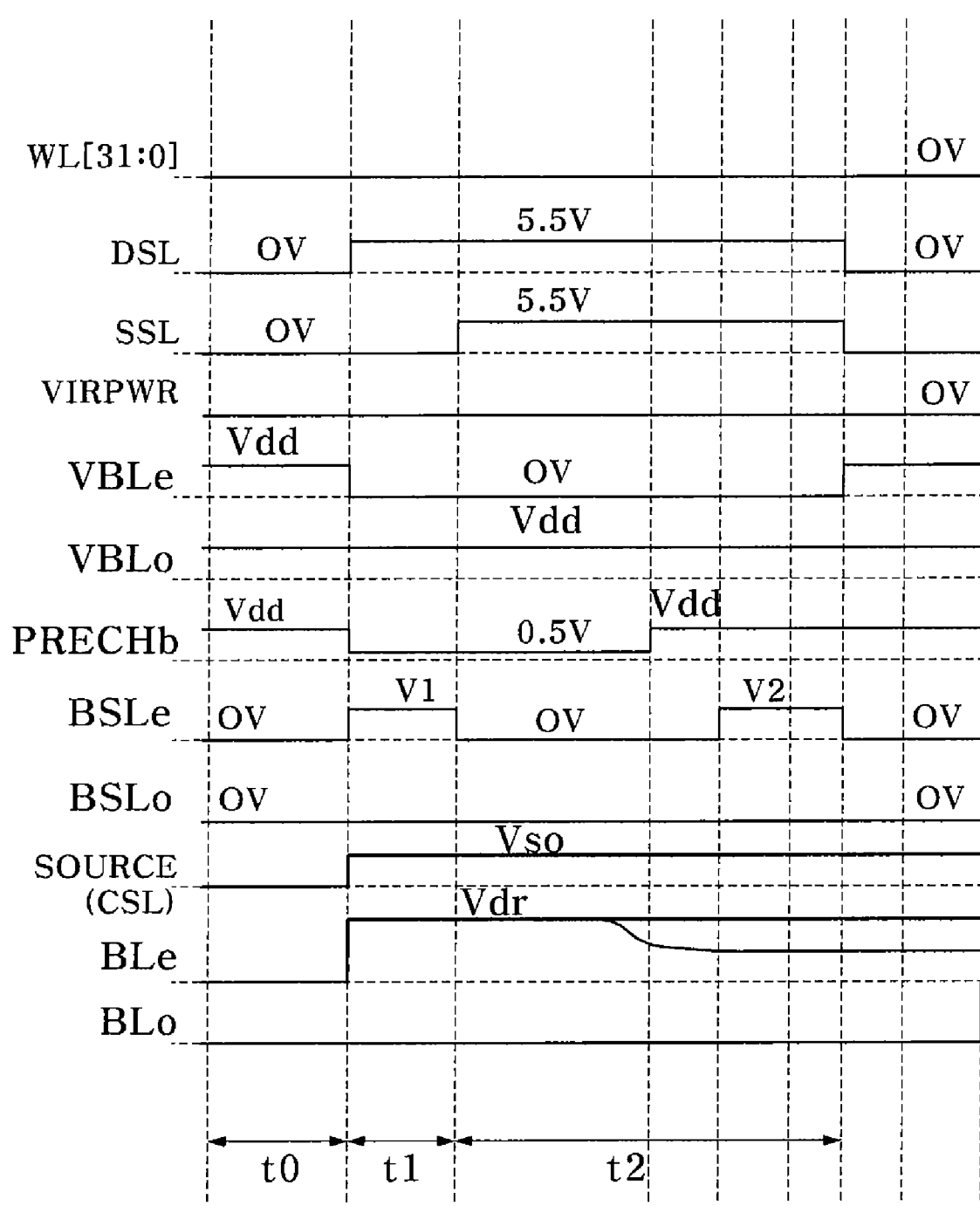
FIG. 7 illustrates a timing diagram of signals in a NAND flash memory device according to one embodiment of the present invention.

FIG. 7 illustrates a timing diagram of the signals in the NAND flash memory device according to one embodiment of the present invention. The erase verify method according to the embodiment of the present invention will be described below with reference to FIGS. 6 and 7.

In a period t0, the selected even bit line BLe is discharged and the page buffer 600 is set so as to verify if the erase operation has been normally performed.

A low signal is inputted to the gates of the drain select transistors, the source select transistors, and the memory cell transistors, which are included in the cell strings 510 and 520. The controls signals VBLe, VBLo and PRECHb of the page buffer 600 are high signals. Therefore, the NMOS transistors M01 and M02 are turned on, and the PMOS transistor M30 is turned off. The power line VIRPWR is grounded. Since the NMOS transistors M01 and M02 are turned on, charges accumulated in the even bit line BLe and the odd bit line BLo flow through the NMOS transistors M01 and M02 to the power line VIRPWR. Consequently, the even bit line BLe and the odd bit line BLo are discharged. Further, the NMOS transistor M20 is turned on by applying the control signal PGM of a high level, so that the Q node is reset to a low level. Since the NMOS transistors M11 and M12 are also turned on during the period t0, the sensing node S0 is set to a low level.

In a period t1, the selected bit line is precharged and the power supply voltage Vcc is applied to the unselected bit line.

During the period t1, the control signals VBLe and PRECHb are changed to a low signal in such a state that the power line VIRPWR of the page buffer 600 is grounded. Therefore, the NMOS transistors M01 and M02 are turned off and the PMOS transistor M30 is turned on. Since the PMOS transistor M30 is turned on, the power supply voltage Vcc is applied to the sensing node S0. The control signal BSLe having a voltage of V1 (e.g., Vcc) is applied to the gate of the NMOS transistor M11. Consequently, the even bit line BLe is precharged to approximately 2 V and the control signal BSLo maintains a low state.

The source voltage Vso of approximately 1 V is applied to the common source line CSL to which the sources of the memory cell transistors are connected. The voltage Vso of approximately 1 V, not 0 V, is applied to the sources of the memory cell transistors. A pass voltage Vpass of approximately 5.5 V is sequentially applied to the drain select line DSL and the source select line SSL of the cell strings 510 and 520. The ground voltage of 0 V is applied to the word lines of the memory cell transistors.

In a period t2, a data sensing is achieved when the even bit line BLe is precharged and predetermined bias voltages are applied to the source line CSL, the drain select line DSL, and the source select line SSL. The period t2 includes a time necessary for sufficiently discharging the charges accumulated in the even bit line BLe. After a predetermined time elapses, the control signal PRECHb is changed to a high level and the PMOS transistor M30 is turned off. The control signal BSLe having a voltage of V2 is applied.

In the case where the selected memory cell transistor is turned on (i.e., the memory cell is in an erased state) the charges accumulated in the even bit line BLe are discharged to the memory cell. Therefore, the voltage of the even bit line BLe decreases to the source voltage Vso. A gate-source voltage (Vgs) of the NMOS transistor M11 is higher than a threshold voltage (Vth) and thus the NMOS transistor M11 is turned on. As the NMOS transistor M11 is turned on, the charges accumulated in the sensing node S0 are rapidly discharged to the even bit line BLe due to charge distribution between capacitance of the even bit line BLe and capacitance of the sensing node S0. Consequently, the voltage of the sensing node S0 decreases from the power supply voltage Vcc to 0 V.

In the case where one or more selected memory cells are turned off (i.e., the one or more memory cells have not been erased properly) the charges accumulated in the even bit line BLe cannot be discharged to the memory cell. Thus, the voltage of the even bit line BLe maintains the voltage of Vdr. Even though the control signal BSLe having a voltage of V2 is applied, the gate-source voltage (Vgs) of the NMOS transistor M11 maintains the same state as the threshold voltage (Vth), so that the NMOS transistor M11 is not turned on. Consequently, the sensing node S0 maintains the power supply voltage Vcc.

If predetermined bias voltages are applied to the source line and the bit line and the voltage applied to the word line is maintained at 0 V, the memory cell transistor having the threshold voltage lower by a difference between bias voltages of the bit line and the source line can be sensed using the erase verify voltage.

If a positive voltage level, not 0 V, is applied as the source voltage, an electric potential of the source of the source select transistor is greater than that of the cell string containing the source select transistor. Thus, the gate bias of the turned-on source select transistor increases, thereby increasing the threshold voltage of the erased memory cell.

As illustrated in FIG. 3, the threshold voltage of the erased memory cell increases as the source voltage Vso increases. For this reason, the state of the memory cell can be easily sensed. The sensing margin increases because the erase verify operation can be effectively performed on the erased memory cell having a negative threshold voltage close to 0 V after the erase operation. A stable erase operation can be achieved by additionally performing the erase operation on the memory cells that did not pass the erase verification, thereby improving the reliability of the semiconductor memory device.

Then, the erase verify operation is performed on the odd bit line BLo.

According to the embodiments of the present invention, since the erase verify voltage is reduced using the body effect of the memory cell, the margin between the erase verify voltage and the read voltage can be ensured and the disturbance can be improved. Further, the erase verification can be easily performed even though the threshold voltage of the erased memory cell changes after the cycling.

While the present invention has been described with respect to the specific embodiments, it will be apparent to those skilled in the art that various changes and modifications may be made without departing from the spirit and scope of the invention as defined in the following claims.

What is claimed is:

1. A method for operating a flash memory device, the method comprising:
performing an erase operation on memory cells in first and second cell strings, the first cell string including a first drain select transistor, a plurality of first memory cells, and a first source select transistor, which are connected in series, the first drain select transistor being connected to a first bit line, the first source select transistor being connected to a common source line;
applying a power supply voltage (Vcc) to the second bit line while precharging the first bit line to a first positive voltage;
turning on the first drain and source select transistors;
applying a ground voltage to word lines of the first memory cells;
applying a second positive voltage to the common source line; and
verifying whether the memory cells have been erased properly.

2. The method of claim 1, further comprising applying a control signal of a high level to a first bit line select switch to select the first bit line.

3. The method of claim 2, wherein the second cell string including a second drain select transistor, a plurality of second memory cells, and a second source select transistor, which are connected in series, the second drain select transistor being connected to a second bit line, the second source select transistor being connected to the common source line, the method further comprising:
applying a control signal of a low level to the second bit line select switch to unselect the second bit line, so that the verifying step is first performed only to the first memory cells.

4. The method of claim 1, wherein the second positive voltage is lower than the first positive voltage.

5. The method of claim 4, wherein the first positive voltage is approximately 2 V and the second positive voltage is approximately 1 V.

6. The method of claim 1, further comprising applying a pass voltage (Vpass) gates of the drain select transistor and the source select transistor.

7. The method of claim 1, further comprising:
discharging charges accumulated in the first bit line and the second bit line before the applying of the power supply voltage to the second bit line; and
placing a page buffer connected to the first bit line and the second bit line in an initial state.

8. The method of claim 1, wherein the first positive voltage about 1 volt higher than the second positive voltage.

9. The method of claim 1, wherein the erase operation is performed on a block including a plurality of cell strings, wherein a pair of cell strings is grouped with a page buffer.

10. The method of claim 9, wherein the erase verification is performed on one of the pairs of the cell strings.

11. A method for operating a flash memory device, the method comprising:
performing an erase operation on a plurality of cell strings; and
performing an erase verification on a selected cell string, the selected cell string including a drain select transistor, a plurality of memory cells, and a source select transistor, which are connected in series, the drain select transistor being connected to a bit line, the source select transistor being connected to a common source line, the erase verification step includes:
precharging the bit line to a first positive voltage,
turning on the select drain and source transistors,
applying a ground voltage to word lines of the memory cell transistors,
applying a second positive voltage to the common source line, and
verifying whether the memory cell transistors have been erased properly.

12. The method of claim 11, wherein the second positive voltage is lower than the first positive voltage.

13. The method of claim 12, wherein the first positive voltage is approximately 2 V and the second positive voltage is approximately 1 V.

14. The method of claim 12, wherein the first positive voltage about 1 volt higher than the second positive voltage.

15. The method of claim 12, wherein the first positive voltage is no more than about 1 volt higher than the second positive voltage.

16. The method of claim 12, wherein the first positive voltage is no more than about 1.5 volt higher than the second positive voltage.

17. The method of claim 12, wherein the first positive voltage is no more than about 1.2 volt higher than the second positive voltage.

* * * * *

UNITED STATES PATENT AND TRADEMARK OFFICE
CERTIFICATE OF CORRECTION

| | |
|---|---|
| PATENT NO. | : 7,606,080 B2 |
| APPLICATION NO. | : 11/967136 |
| DATED | : October 20, 2009 |
| INVENTOR(S) | : Ju Yeab Lee |

Page 1 of 1

It is certified that error appears in the above-identified patent and that said Letters Patent is hereby corrected as shown below:

Column 8, after line 54, please insert:

--18. The method of claim 12, wherein the first positive voltage is no more than about 0.8 volt higher than the second positive voltage.--

Signed and Sealed this

Twenty-sixth Day of January, 2010

David J. Kappos
*Director of the United States Patent and Trademark Office*